United States Patent [19]
Jolly et al.

[11] Patent Number: 5,269,880
[45] Date of Patent: Dec. 14, 1993

[54] TAPERING SIDEWALLS OF VIA HOLES

[75] Inventors: Gurvinder Jolly, Orleans; Bud K. Yung, Ottawa, both of Canada

[73] Assignee: Northern Telecom Limited, Montreal, Canada

[21] Appl. No.: 862,690

[22] Filed: Apr. 3, 1992

[51] Int. Cl.$^5$ .............................................. H01L 21/00
[52] U.S. Cl. .................................... 156/643; 156/644; 437/947; 437/981; 148/DIG. 161; 257/774
[58] Field of Search ................ 156/643, 644; 437/947, 437/981; 148/DIG. 161; 257/774

[56] References Cited

U.S. PATENT DOCUMENTS

| | | | |
|---|---|---|---|
| 4,489,481 | 12/1984 | Jones | 29/591 |
| 4,814,041 | 3/1989 | Auda | 156/644 |
| 4,948,743 | 8/1990 | Ozaki | 437/40 |
| 4,978,420 | 12/1990 | Bach | 156/644 |
| 4,985,374 | 1/1991 | Tsuji et al. | 437/229 |
| 4,986,877 | 1/1991 | Tachi et al. | 156/643 |
| 5,203,957 | 4/1993 | Yoo et al. | 156/644 |

FOREIGN PATENT DOCUMENTS

| | | | |
|---|---|---|---|
| 3914602 | 11/1990 | Fed. Rep. of Germany . | |
| 56-131948 | 10/1981 | Japan . | |
| 62-260332 | 11/1987 | Japan | 437/947 |
| 1-273333 | 11/1989 | Japan . | |
| 2-12827 | 1/1990 | Japan | 437/981 |
| 3-283616 | 12/1991 | Japan | 437/981 |

OTHER PUBLICATIONS

S. Wolf, *Silicon Processing for the VLSI Era*, vol. 2, Lattice Press, Sunset Beach, Calif., 1990, pp. 220–222, 240–245.

*Primary Examiner*—Brian E. Hearn
*Assistant Examiner*—Laura M. Holtzman
*Attorney, Agent, or Firm*—Angela C. de Wilton

[57] ABSTRACT

A method of tapering side walls of via holes and a tapered via hole structure for an integrated circuit is provided. Via holes having steep sidewalls are provided in an insulating layer overlying a conductive layer on a substrate, with an underlying conductive layer exposed at a bottom of each via hole. A protective layer is provided over the conductive layer in each via hole, and over the sidewalls. The via holes are then tapered by argon sputter etching to remove the protective layer and part of the insulating layer from the sidewall and around the peripheral edge of each via hole, thereby smoothly tapering the sidewall and providing a via hole increasing continuously in diameter from the bottom to the upper peripheral edge of the via hole. Via holes of multiple depths are simultaneously and smoothly tapered to the bottom of the via holes Any sputtered debris remaining in the via holes after the sputter etch step is removed by reactive ion etching to clean the conductive layer exposed in each via hole and allow for formation of reliable electrical contacts.

14 Claims, 3 Drawing Sheets

TAPERING SIDEWALLS OF VIA HOLES

FIELD OF THE INVENTION

This invention relates to a method of tapering sidewalls of via holes for an integrated circuit and a via hole structure for an integrated circuit.

BACKGROUND OF THE INVENTION

In fabrication of CMOS devices for VLSI integrated circuits, conductive paths or contacts between first and second conductive films separated by a intervening dielectric layer are formed by defining a via hole or contact hole through the dielectric layer, and then filling the via with conductive material. For example, a dielectric layer of an insulating material such as silicon dioxide, is deposited on a first conductive layer comprising a metal or alloy, such as sputtered aluminium. The insulating layer is selectively masked, and a contact hole or via hole is etched through an exposed region in the insulating layer to expose the underlying conductive layer. A second conductive layer, e.g. sputtered aluminium, is deposited over the insulating layer, with conductive material extending into the via hole, thereby forming a contact between the two conductive layers. Alternatively the via hole may be filled with a plug of conductive material before deposition of the second conductive layer.

Integrated circuits incorporating multilayer conductors may comprise three or more conductive metal layers, each defining metal lines, and separated from the other metal layers by intermetal dielectric layers. In a triple level metal (TLM) structure having three layers of metallization, contact via holes from a first conductive layer to second conductive layer and then from second to third conductive layer, must each pass through at least one layer of intermetal dielectric. To provide a planarized structure having a relatively smooth surface topography, via holes having a depth differential of $\geq 5000$ Å may be required between the different levels of conductive layers.

The critical dimensions or "cds" of the via hole, that is, the maximum and minimum diameter of the contact area with a conductive layer, are controlled so as to comply with the design rules for semiconductor device structures. In particular, the area defined by the bottom diameter of a via hole should lie within the line width of conductive metal lines. The via hole diameter should provide for sufficient contact area for satisfactory electrical performance, but overlap into other regions which may cause electrical problems should be avoided. To simplify the layout of an integrated circuit, it is preferable that deep and shallow via holes are provided with the same critical dimensions.

Further, in order to provide reliable electrical contacts, it is important that the deposited metal satisfactorily fills the via hole, i.e. provides adequate "step coverage" over the sidewalls, base and edges of the hole without leaving voids or non-uniform regions. It is well known that step coverage of sputtered metal in a deep via hole is improved by tapering of the sidewalls of the via hole, so that the diameter of the via hole is greater at the top than at the bottom. Sidewall tapering of via holes is particularly desirable to obtain adequate step coverage of sputtered metal in via holes having high aspect ratios, i.e. where the depth to width ratio is greater than 0.5.

A number of approaches to tapering sidewalls of via holes of uniform depth are known. Generally dry etching methods based on known isotropic and anisotropic reactive ion etch processes which avoid or minimize surface damage are preferred for defining structures of small geometry. More aggressive etch processes, including sputter etching, are avoided and generally considered unsuitable for defining submicron features such as via holes.

One approach is to provide for a progressive change in etch rate during the process of etching a via hole. For example, an insulating film may be deposited wherein the composition of the insulating film changes with thickness to provide a gradient in etch rate: German Patent DE3914602 discloses deposition of the insulating film as three separate thin layers of different composition and Japanese Patent J56131948 discloses method of depositing an insulating glass layer having a composition gradient. Both these structures provide for a differential etch rate through the thickness of the insulating layer. Another approach is to provide an insulating film of homogeneous composition and to change the etchant composition progressively as etching proceeds, for example, during a reactive ion etching process, by successively changing the composition of reactive gases in stages as the etch process proceeds. As an example, in U.S. Pat. No. 4,814,041 to Auda there is disclosed a process wherein the composition of plasma etchant is changed to provide an increased concentration of oxidizer as etching proceeds. U.S. Pat. No. 4,985,374 to Tsuji discloses use of successive dry etching steps to form a stepwise tapered contact hole and U.S. Pat. No. 4,986,877 to Tachi discloses a temperature gradient during etching to control etch rate as a function of etch depth. However, it will be appreciated that problems arise in such complex multistage processing in maintaining precise control of the etching process to provide via holes of a uniform depth while maintaining cds, and it will be apparent that etching of via holes of large depth differential is impractical by the above-mentioned methods.

Another known method of tapering sidewalls of via holes, e.g. as described in U.S. Pat. No. 4,948,743 to Matsushita, includes providing a dielectric layer which may be heated and caused to reflow around a via hole, thereby rounding off the edges and tending to taper the via hole. Any dielectric which tends to flow into the base of the hole and cover the conductive layer is then removed by reactive ion etching. However, this method has the disadvantage that the resulting sidewall taper is small, and the contact area is not reliably defined by a lithographic step, but depends on the extent and uniformity of the reflow step.

In yet another approach, a tapered sidewall spacer is formed within a steep-sided via hole, by deposition of a film of silicon dioxide or polysilicon which is then anisotropically etched to leave a rounded sidewall spacer having a tapered upper edge, so that the tapered sidewall defines a smaller area contact hole, self-aligned within the original steep-sided hole, as disclosed in U.S. Pat. No. 4,489,481 to Jones and Japanese patent J01273333 to Natori. This technique provides a small taper to the top part of the sidewall, while the bottom part is vertical due to the anisotropy of the reactive ion etching process. To increase the taper, the thickness of deposited oxide has to be increased to more than 5000 Å and consequently requires etching of a correspondingly oversized steep-sided via hole to allow for the thick sidewall spacer. This results in the disadvantage that the minimum metal line width must be large enough to accommodate the oversized steep-sided hole. Furthermore, since the sidewalls define a self-aligned contact area within the steep-sided hole, the bottom diameter of resulting tapered via hole is not directly defined lithographically.

With the exception of the latter method, application of the above-mentioned methods of sidewall tapering to tapering of via holes of different depth, particularly for via holes of large depth differential, would require that shallow via holes and deep via holes be defined in separate sequences of process steps. However, since each sequence itself involves multiple process steps, the above-mentioned methods are impractical and unsatisfactory for etching via holes for multilevel interconnect structures. Consequently, other approaches have been developed for simultaneously etching via holes of different depths for multilevel metal interconnects.

For example, one known method provides for a shallow isotropic etch to provide a tapered (bowl-shaped) shallow portion and then an anisotropic etch from the centre region of the shallow portion of the via hole so as to create a steep-sided, deep portion (i.e. the via hole is shaped like a countersunk screw hole). The metal layer at the bottom of the shallow via holes acts as an etch stop during further etching of the deep via holes down to the deeper level metal. Shallow via holes are predominantly tapered and bowl shaped, with a short, steep-sided deeper portion; deep via holes comprise a corresponding shallow tapered portion plus a deeper steep-sided portion, but consequently the deeper via holes are difficult to fill with sputtered metal of good quality. Although the diameter at the base of the via holes is controlled by the anisotropic etch (i.e. defined by masking/lithography), the isotropic etch depth cannot be deeper than the shallowest via holes without losing the cd of the shallow via holes. Thus, for example, where the depth differential between shallow and deep via holes is ~5000 Å, and the via hole size is less than 1.5 to 2.0 μm, this latter method is not satisfactory.

Another known method for sidewall tapering of multiple depth via holes is based on a multi-step resist erosion process, which creates a via hole having stepped sidewalls. The process involves defining openings in a thick film of resist and anisotropically etching a via hole partially through an insulating film to a first predetermined depth. Then edges of the resist are eroded, for example, by an isotropic etch or sputtering processes to enlarge the hole in the mask, followed by a further anisotropic etch to enlarge the top part of the via hole and cut deeper into the previously etched first centre portion of the via hole, resulting in a step in the sidewall. The process steps of resist erosion and anisotropic etching are repeated until each via hole reaches the required depth and the underlying metal provides an etch stop. In this way via holes of differing depths having staircase-like stepped sidewalls may be created. However, the cd (bottom diameter) of shallow via holes is greater than deep via holes, this difference being significant when the depth differential between shallow and deep via holes is high. Furthermore, the process requires an initial undesirably thick coating of resist followed by multiple process steps and the resulting stepped profile may not provide for satisfactory step coverage.

SUMMARY OF THE INVENTION

The present invention seeks to provide a via hole structure and a method of tapering sidewalls of via holes for integrated circuits which avoids or reduces the abovementioned problems.

According to one aspect of the present invention, there is provided a method of tapering sidewalls of via holes comprising: providing a substrate having a conductive layer, a protective layer overlying at least a selected region of the conductive layer, and an insulating layer overlying the conductive layer surrounding the selected region with the insulating layer defining steep sidewalls of a via hole extending from a bottom to an upper edge of the via hole, with the protective layer defining the bottom of a via hole; and sputter etching the protective layer and the insulating layer to remove the protective layer and a portion of the insulating layer at the upper edge of the via hole to provide a via hole increasing continuously in lateral dimensions from the bottom to the upper edge of the via hole.

Thus via holes having smoothly tapered sidewalls are provided using a single sputter etching step. Problems associated with surface damage caused during sputter etching are avoided by providing a protective layer over the conductive layer in the via hole. Preferably, where an electrical contact is to be made to the underlying conductive layer within a via hole, any sputtered debris remaining in the via hole after the sputter etch step is removed, for example by reactive ion etching to expose the conductive layer. Thus a conductive layer having a clean surface free of sputtered material is provided so that reliable electrical contacts may be formed.

According to another aspect of the present invention there is provided a method of tapering sidewalls of via holes comprising: providing a substrate having a first conductive layer, an insulating layer overlying the conductive layer, the insulating layer defining therethrough a steep-sided via hole, the insulating layer forming a steep sidewall of the via hole extending from a peripheral edge to a bottom of the hole and the underlying conductive layer being exposed at the bottom of the via hole; providing a protective layer of a uniform predetermined thickness extending over the insulating layer and over sidewalls of the via hole and over the exposed conductive layer within the via hole; sputter etching the protective layer and the insulating layer to remove the protective layer and etch the insulating layer, whereby during sputter etching to remove the predetermined thickness of the protective layer from the conductive layer, material of the insulating layer is removed by sputtering from the peripheral edge and from the sidewall of the via hole thereby smoothly tapering the sidewall, to provide a tapered via hole increasing continuously in diameter from the bottom of the via hole towards the peripheral edge of the via hole.

Preferably the protective layer is a layer of the same material as the insulating layer, and the protective layer is provided by chemical vapour deposition. Advantageously, the steep sided via holes are cleaned with photoresist stripper before deposition of the protective layer. Where the insulating layer and the protective layer are silicon dioxide, the sputter etch preferably comprises an argon sputter etch and any sputtered material remaining in the via hole after sputter etching may be removed conveniently from the via hole by reactive ion etching. Thus, a smoothly and uniformly tapered via hole of an arbitrary depth is produced in a reduced number of process steps.

According to yet another aspect of the present invention there is provided a method of tapering sidewalls of via holes for multilevel interconnect structures, comprising: providing a substrate having a conductive layer and an overlying insulating layer, the insulating layer defining steep sidewalls of a plurality of deep and shallow via holes extending therethrough, a shallow via hole extending through a first thickness of the dielectric layer and a deep via hole extending through a second and greater thickness of the insulating layer, portions of the conductive layer being exposed within a bottom of each via hole; providing a protective layer of a uniform predetermined thickness extending over the insulating layer and over sidewalls of each via hole and over the conductive layer exposed within each via hole; sputter etching the protective layer and the insulating layer to remove the protective layer and etch the insulating layer, whereby during sputter etching to remove the predetermined thickness of the protective layer from the conductive layer in each via hole, material of the insulating layer is removed by sputtering from the peripheral edge and from the sidewall of each via hole thereby smoothly tapering each sidewall to provide a tapered via hole increasing continuously in diameter from the bottom of the via hole towards the peripheral edge of the via hole.

Thus, where a structure provides for multilevel metal interconnects, via holes of multiple depths may be simultaneously and uniformly tapered, while cds, i.e. bottom diameters, of the vias are maintained substantially the same for both shallow and deep via holes. Thus an etch process is provided which avoids the complex multistage processes of known methods of tapering sidewalls of deep and shallow via holes.

According to a further aspect of the present invention there is provided a via hole structure for an integrated circuit comprising: a substrate supporting a conductive layer and an overlying insulating layer, the insulating layer defining sidewalls of a plurality of deep and shallow via holes extending therethrough, a shallow via hole extending through a first thickness of the insulating layer to define a contact area on the underlying conductive layer within the shallow via hole, and a deep via hole extending through a second and greater thickness of the insulating layer to define a contact area on the underlying conductive layer within the deep via hole, and the sidewalls of each via hole being smoothly tapered so that the diameter of the via hole increases continuously and smoothly from a bottom of the via hole to a peripheral edge of the via hole.

Thus, the present invention provides a method of tapering sidewalls of via holes for an integrated circuit and a via hole structure for an integrated circuit in which the above-mentioned problems are reduced or avoided.

BRIEF DESCRIPTION OF THE DRAWINGS

An embodiment of the invention will now be described by way of example, with reference to the accompanying drawings, in which.

DESCRIPTION OF THE PREFERRED EMBODIMENT

Figure 1A:
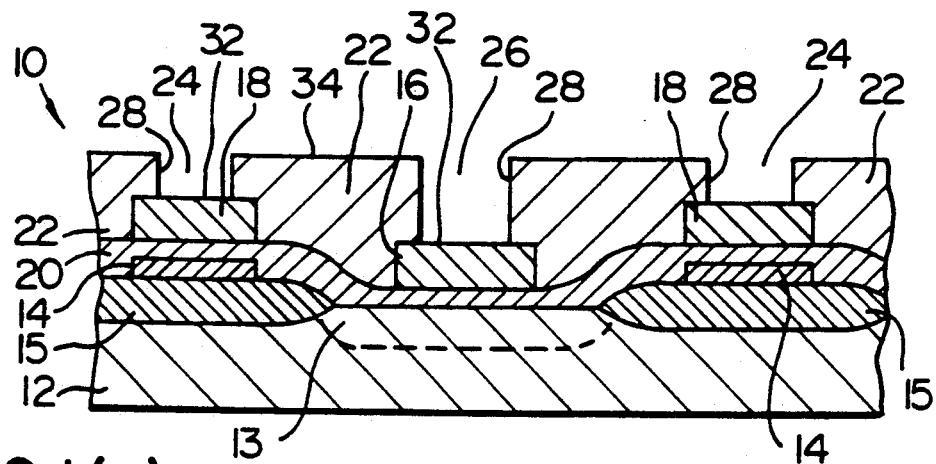
FIGS. 1A to 1C shows a schematic cross-sectional view through part of an integrated circuit structure at successive steps of a method of tapering sidewalls of via holes according to an embodiment of the invention.
Figure 1B:
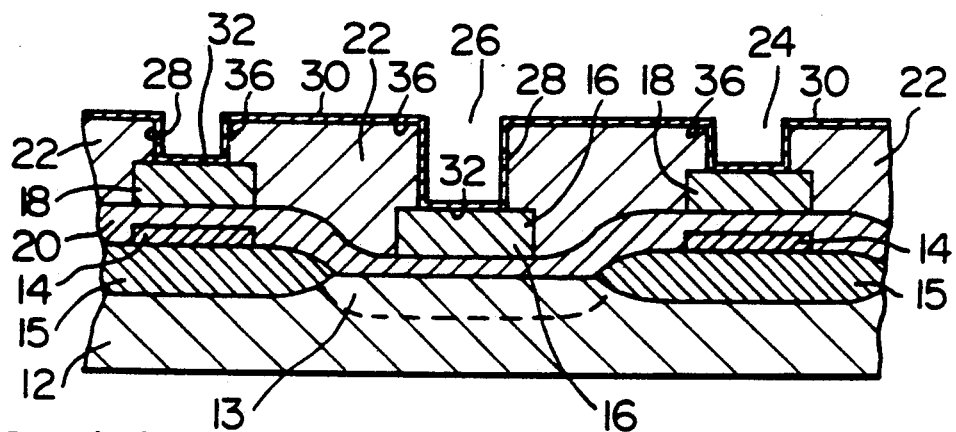
Figure 1C:
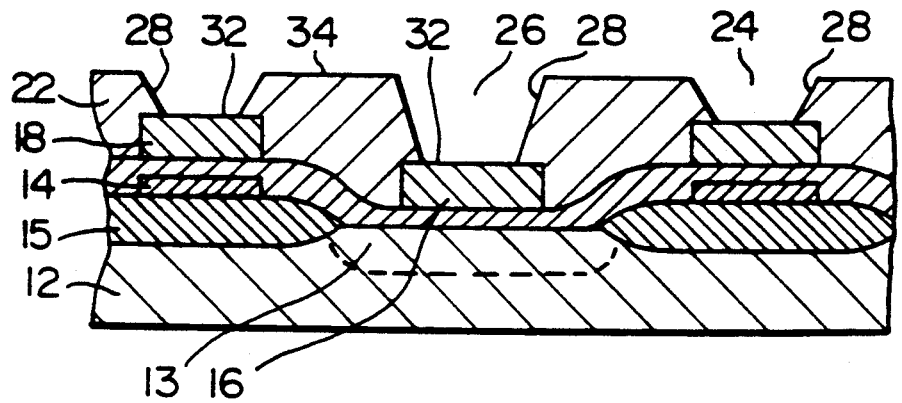

A cross-sectional view of part of a integrated circuit structure 10 at successive steps during a method of tapering sidewalls of via holes according to an embodiment of the present invention is shown in FIGS. 1A to 1C. The structure 10 comprises a substrate in the form of part of a semiconductor wafer 12, having elements 13, 14 and 15 of CMOS device structures defined thereon, an overlying insulating dielectric layer of borophosphosilicate glass (BPSG) 20, and a first conductive metal layer, comprising portions 16 and 18 forming interconnects which are vertically spaced apart because the underlying topography is non-planar. The portions 16 and 18 of interconnect are separated by a further layer of insulating dielectric 22, e.g. a layer of silicon dioxide. Vias holes 24 and 26 of different depths, having steep sidewalls 28 are defined through the insulating layer of silicon dioxide 22 and expose portions of the metal layer at the bottom of each via hole.

The steep-sided via holes 24 and 26 are provided by a known conventional method, for example, a step of selectively masking the insulating layer 22 by coating with photoresist, patterning the photoresist to leave exposed regions of the insulating layer, and anisotropically etching exposed regions to define via holes with steep sidewalls 28. Where the insulating layer 22 is silicon dioxide a suitable known anisotropic etch is provided by reactive ion etching using an etch gas mixture of $CHF_3/O_2$ in a commercially available reactive ion etch (RIE) reactor. The underlying metal interconnect layers 16 and 18 serve as an etch stop at the bottom of the via holes. Thus, where exposed regions define circular areas, anisotropic etching provides a round via hole having a uniform lateral critical dimension, i.e. diameter, and a sidewall of cylindrical form. Thus, after removing the photoresist, the substrate is provided with a plurality of steep-sided via holes of different depths through the insulating layer 22 having a predetermined uniform bottom diameter cd which is defined lithographically (i.e. in the step of patterning the photoresist).

After cleaning the sidewalls with an organic photoresist stripper, the steep-sided via holes of different depth are tapered using the following steps. A thin film of a predetermined thickness of ~120 nm to ~150 nm of a protective layer 30, preferably the same material as the insulating layer 22, i.e. silicon dioxide, is deposited overall. The protective layer 30 of silicon dioxide is deposited by a conventional method of chemical vapour deposition, CVD, to form a thin protective layer of substantially uniform thickness extending all over the surface of the dielectric layer 22, on the sidewalls 28 and on the bottom 32 of the via holes 24 and 26 over the conductive layer. For example, a process using chemical reaction between tetraethoxysilane (TEOS) and $O_2$ in a commercially available reactor, an Applied materials CVD 5000 System, was found to give uniform coverage under the following process conditions: pressure 9 Torr, power 420 Watts, temperature 390° C., gap between electrodes 185 mil, TEOS flow rate 500 sccm, $O_2$ flow rate 400 sccm. The deposition time for a 150 nm layer of protective oxide was 12 seconds.

The resulting structure is then sputter etched to remove the layer 30 of ~150 nm $SiO_2$ from the via holes 24 and 26, using an argon ion etch. The argon sputter etch results in removal of the protective layer of $SiO_2$ from the surface of the insulating layer 22 and from the sidewalls 28 and the bottom 32 of the via hole, while simultaneously material is also sputtered from the upper peripheral edge 36 of the surface 34 of the insulating layer 22 around each via hole and from the sidewalls 28 of the via holes, thereby tapering the sidewalls as shown in FIG. 1c. The argon sputter etch is carried out in suitable commercially available sputter etch apparatus. As an example, using the etch chamber of the Applied Materials CVD 5000 System, a suitable argon ion etch process was operated at a pressure of 27 mtorr, an argon gas flow rate of 50 sccm, RF power of 450 Watt, and magnetic field of 80 Gauss, to remove 140 nm of a protective layer of silicon dioxide in 200 seconds.

The thickness of the protective layer 30 is an order of magnitude thinner than the thickness of the insulating layer, which may be ~1-2 μm thick. The protective layer 30 functions as sputter etch stop to protect the metal in the bottom of the via hole from sputter damage, and thus to prevent removal of or damage to the metal in the bottom of the via hole during sputter etching and tapering of the sidewalls. The etch rate of a sputter etch is dependent on the angle of incidence of etchant ions on the surface to be etched. Thus, the angular dependence of the etch rate of the sputter etching process provides that the peripheral edge 36 of the sidewalls 28 of the insulating layer is etched back a faster rate in an angular direction, so as to taper the sidewalls, the peripheral edge of the via hole being etched back in a horizontal direction as viewed in FIG. 1c, while the protective layer within the via hole is etched in relatively slowly in a vertical direction to expose the underlying conductive layer 16 or 18 at the bottom of the via hole, the protective layer also being removed from the upper surface 34 of the insulating layer around the via hole. Thus by suitable selection of the predetermined thickness of the protective layer, while the protective layer is sputter etched from the conductive layer, the peripheral edges 36 and the sidewalls 28 of the via holes are etched relatively rapidly in an angular direction to form a desired smoothly tapered sidewall.

The protective layer functions as an etch stop for the conductive layer, and is sacrificial, being removed during the sputter etching step, but protecting the conductive layer from sputtering damage. However, after sputtering, some sputtered material may be left in the via hole. Part of the protective layer may not be completely removed and a very thin film of the protective layer may remain in the via hole.

Where electrical contacts are to be formed within a via hole defined in silicon dioxide, sputtered debris from sidewalls of the via hole or a residual part of the protective layer may interfere with formation of a reliable electrical contact within the bottom of the via hole. Thus, any sputtered material remaining in the via hole is cleaned by a short reactive ion etch to expose a clean conductive layer within the via hole. Any remaining part of the protective layer is removed during ion etching. For example, using the Applied materials CVD 500 system, ion etching for 36 seconds using a $CF_4$ gas mixture with typical operating conditions of pressure 200 mtorr, power 600 Watt, $CF_4$ flow rate 120 sccm, was found to remove sputtered material from the bottom of the via hole.

In application of the method according to the embodiment for sidewall tapering, deep and shallow via holes may be uniformly tapered simultaneously, after deposition of a thin protective layer of oxide, by a sputter etch step, followed by a brief clean up by reactive ion etching. No heat treatment or multiple masking processes are required. Conveniently, deposition of the protective layer, argon sputter etching, and the RIE cleanup step are performed in a single pass through the multichamber Applied Materials CVD 5000 System. Alternatively these process steps may be performed in separate passes through other appropriate single chamber CVD and etch systems.

Although sputtering is well known to provide an angularly dependent etch rate, where a controlled amount of etching in a particular direction can be obtained, sputter etching processes are usually considered too aggressive and damaging for defining features of small dimensions such as sub-micron via holes. Generally, a sputter etch would tend to damage an unprotected conductive layer within the via hole, and damage other exposed and unprotected substrate materials, and leave sputtered debris from these materials in the via hole. However, in the method of the embodiment, the damaging effects of sputter etching are circumvented by deposition of a thin protective oxide layer of a predetermined thickness before sputter etching. It was found to be advantageous in obtaining a via hole having a smoothly tapered sidewall, to clean the steep sidewall prior to deposition of the protective layer. This was accomplished with a wet cleaning step, for example, using an organic photoresist stripper, to remove any traces of photoresist remaining on the steep sidewalls, before depositing the protective layer. To provide a clean conductive surface for formation of contacts within a via hole, sputter etching is advantageously applied in combination with a subsequent reactive ion etch or other cleaning step, to remove any sputtered debris from the via hole and expose the conductive surface within the via hole. Thus the method according to the embodiment provides a controllable process which is applicable to defining smoothly tapered sidewalls for via holes of large depth differential.

It will be clear that above-mentioned process conditions are given by way of example. The method of the invention may be applied to tapering sidewalls of steep-sided via holes provided in insulating layers formed by other known processes. Furthermore, the operating conditions for the deposition of the protective layer, argon sputter etch and reactive ion etch may be varied within conventional known ranges, dependent on equipment, to adapt the method of the embodiment to the particular materials used for the insulating layer and the protective layer, while remaining within the scope of the invention.

Figure 2:
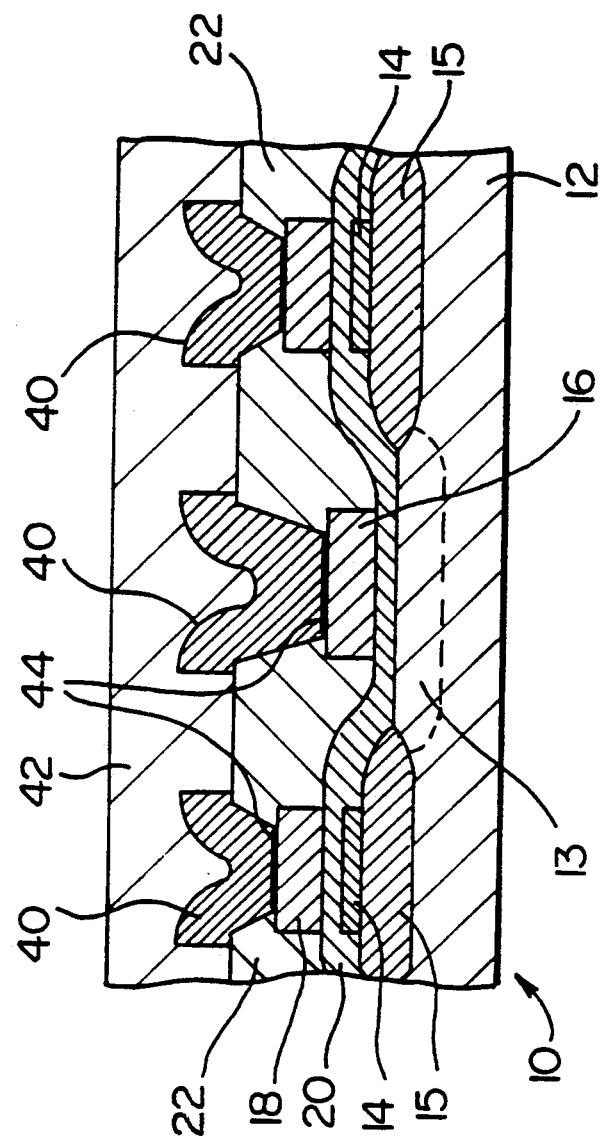
FIG. 2 shows a schematic cross-sectional view through part of an integrated circuit structure according to the embodiment of the invention.
Figure 3:
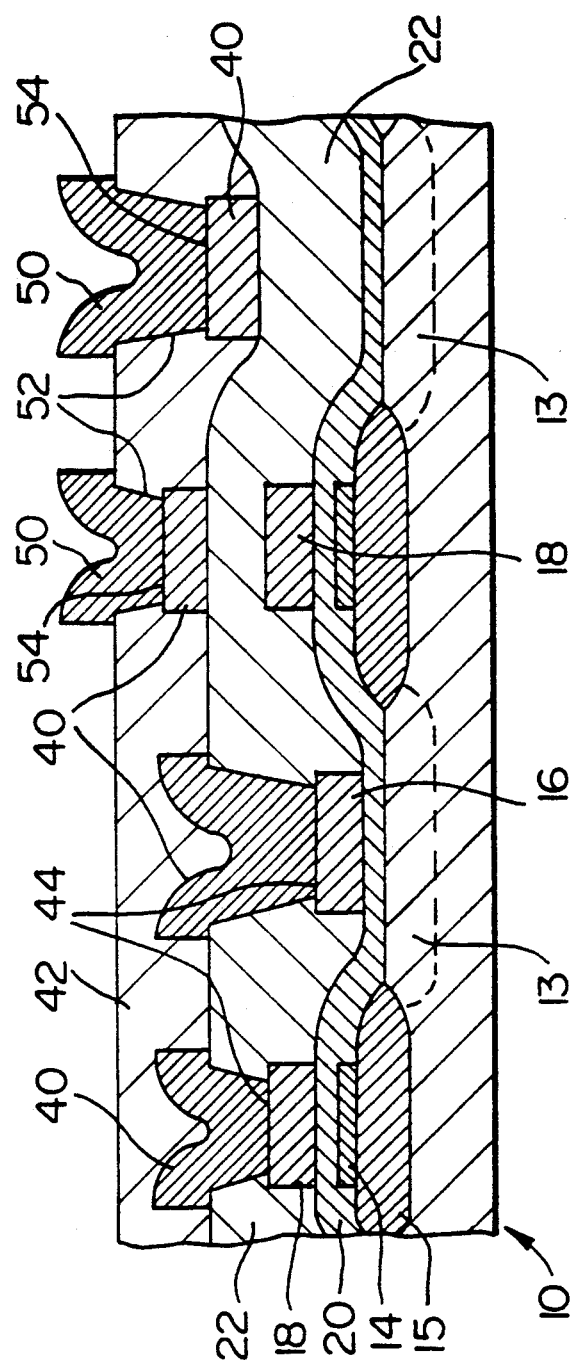
FIG. 3 shows a schematic cross sectional view of another part of the integrated circuit structure of FIG. 2 at a later stage of processing.

The resulting tapered via holes may be filled with a conductive material, for example, an aluminium alloy, deposited by a conventional known method to form a conductive interconnect structure. A fully planarized topography may be achieved with multi-level metal interconnect structures as illustrated in FIG. 2 and 3. FIG. 2 shows the same parts of an integrated circuit structure as in FIG. 1A to 1C, at a later stage of processing, after formation of a conductive interconnect structure 40 and deposition of an overlying passivation layer 42. The interconnect 40 is in the form of metal lines formed by sputter deposition of aluminium alloy to fill the via holes. The resulting second level metal lines 40 extend into the via holes 24 and 26 and provide electrically conductive contacts at interfaces 44 with portions 16 and 18 of the underlying first metal layer.

FIG. 3 includes others parts of the integrated circuit of FIGS. 1 and 2, after a further stage of processing, including another third level of interconnect 50. The interconnect 50 comprises a third level of metal (ie. aluminium alloy) extending into tapered via holes 52 through dielectric layer 42. The tapered via holes 52 are formed in the same way as tapered via holes 24 and 26 by the method according to the embodiment. Thus the third layer metal 50 forms electrically conductive contacts at interfaces 54 with underlying second level metal layer 40, and a fully planarized topography is achieved.

The smoothly tapered sidewalls providing for excellent step coverage in both the shallow and deep via holes. The lateral critical dimensions, i.e. diameters of both the deep and shallow holes are almost identical, the minimum diameter of each of the shallow and deep via holes being respectively the same, and sidewalls of the deep and shallow via holes being continuously, smoothly tapered. The cross-sectional profiles of deep and shallow via holes differ only in depth and the slope of the taper of the sidewalls.

The method of the present invention and the resulting tapered via hole structure is particularly applicable for sidewall tapering of via holes for multilevel metal interconnect structures for integrated circuits because via holes of a wide depth differential, extending through different thicknesses of an insulating layer, are simultaneously and evenly tapered to provide equivalent cd (diameter) at the bottom of both deep and shallow via holes. Design rules for minimum line width at each level of metal are thus simplified. Sidewall tapering of very deep via holes to the bottom of the via holes may be achieved. In particular, the method is found to provide superior step coverage for via holes having a depth differential of $\geq 0.5$ μm, and provides substantially uniform cds, without significant blooming of shallow via holes.

What is claimed is:

1. A method of tapering sidewalls of via holes comprising:
    providing a substrate having a first conductive layer, an insulating layer overlying the conductive layer, the insulating layer defining therethrough a steep-sided via hole, the insulating layer forming a steep sidewall of the via hole extending from a peripheral edge to a bottom of the hole and the underlying conductive layer being exposed at the bottom of the via hole;
    providing a protective layer of a uniform predetermined thickness extending over the insulating layer and over sidewalls of the via hole and over the exposed conductive layer within the via hole; and
    sputter etching the protective layer and the insulating layer to remove the protective layer and etch the insulating layer, whereby during sputter etching to remove the predetermined thickness of the protective layer from the conductive layer, material of the insulating layer is removed by sputtering from the peripheral edge and from the sidewall of the via hole thereby smoothly tapering the sidewall, to provide a tapered via hole increasing continuously in diameter from the bottom of the via hole towards the peripheral edge of the via hole.

2. A method according to claim 1 comprising a step of removing sputtered debris from the bottom of the tapered via hole after the sputter etching step, thereby exposing the conductive layer within the via hole.

3. A method according to claim 2 wherein the step of removing sputtered debris from the bottom of the tapered via hole comprises reactive ion etching of sputtered material.

4. A method of tapering sidewalls of via holes for multilevel interconnect structures, comprising:
    providing a substrate having a conductive layer and an overlying insulating layer, the insulating layer defining steep sidewalls of a plurality of deep and shallow via holes extending therethrough, a shallow via hole extending through a first thickness of the dielectric layer and a deep via hole extending through a second and greater thickness of the insulating layer, portions of the conductive layer being exposed within a bottom of each via hole;
    providing a protective layer of a uniform predetermined thickness extending over the insulating layer and over sidewalls of each via hole and over the conductive layer exposed within each via hole; and
    sputter etching the protective layer and the insulating layer to remove the protective layer and etch the insulating layer, whereby during sputter etching to remove the predetermined thickness of the protective layer from the conductive layer in each via hole, material of the insulating layer is removed by sputtering from the peripheral edge and from the sidewall of each via hole thereby smoothly tapering each sidewall to provide a tapered via hole increasing continuously in diameter from the bottom of the via hole towards the peripheral edge of the via hole.

5. A method according to claim 4 comprising a step of removing sputtered debris from the bottom of each tapered via hole after the sputter etching step thereby exposing the conductive layer within the or each via hole.

6. A method according to claim 5 wherein the step of removing sputtered debris from the bottom of the via holes comprises reactive ion etching of sputtered material.

7. A method according to claim 4 wherein the step of providing an insulating layer defining a steep-sided via hole therethrough comprises providing a layer of silicon dioxide by chemical vapour deposition and anisotropically etching a selected area of the insulating layer to provide a steep-sided via hole extending through the insulating layer.

8. A method according to claim 4 wherein the insulating layer comprises silicon dioxide, and the step of providing a protective layer comprises chemical vapour deposition of a layer of silicon dioxide.

9. A method according to claim 8 wherein sputter etching comprises argon sputter etching.

10. A method according to claim 8 wherein sputter etching comprises argon ion sputter etching and wherein the step of removing sputtered material from the bottom of the via hole comprises reactive ion etching by exposure to a plasma generated from a fluorine containing gas.

11. A method according to claim 10 wherein the fluorine containing gas comprises a gas selected from the group $CF_4$, $CHF_3$, $C_2F_6$ and $SF_6$.

12. A method according to claim 4 comprising cleaning sidewalls of the via holes with organic photoresist stripper before the step of providing a protective layer.

13. A method according to claim 1 comprising the step of providing an insulating layer defining steep-sided via holes comprises selectively etching a plurality of steep-sided via holes of different depths by a process of anisotropic etching, and wherein the step of sputter etching simultaneously tapers holes of different depths and provides contact holes with uniformly tapered sidewalls, and the diameter of each via hole continuously and smoothly increases from the bottom of the hole towards the peripheral edge of the hole.

14. A method according to claim 13 wherein the plurality of steep-sided via holes are provided having the same diameter, and after tapering of the via holes, the bottom diameter of the each via hole is substantially the same diameter.

* * * * *